(12) United States Patent
Kim

(10) Patent No.: US 11,410,579 B2
(45) Date of Patent: Aug. 9, 2022

(54) DISPLAY DEVICE

(71) Applicant: Samsung Display Co., Ltd., Yongin-Si (KR)

(72) Inventor: Sang-Ho Kim, Gwangmyeong-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 204 days.

(21) Appl. No.: 16/924,634

(22) Filed: Jul. 9, 2020

(65) Prior Publication Data

US 2021/0118334 A1 Apr. 22, 2021

(30) Foreign Application Priority Data

Oct. 21, 2019 (KR) .................. 10-2019-0130475

(51) Int. Cl.
*G09F 9/30* (2006.01)
*H01L 51/52* (2006.01)
*H01L 51/00* (2006.01)
*F21V 8/00* (2006.01)

(52) U.S. Cl.
CPC .......... *G09F 9/301* (2013.01); *G02B 6/0015* (2013.01); *G02B 6/0035* (2013.01); *H01L 51/0097* (2013.01); *H01L 51/5275* (2013.01)

(58) Field of Classification Search
CPC ..... G09F 9/301; G02B 6/0015; G02B 6/0035; H01L 51/0097; H01L 51/5275
See application file for complete search history.

(56) References Cited

U.S. PATENT DOCUMENTS

| 9,753,432 | B2 | 9/2017 | Pyun et al. |
| 10,319,291 | B2 | 6/2019 | Ikeda et al. |
| 2019/0011881 | A1 | 1/2019 | Tan et al. |
| 2019/0187472 | A1 | 6/2019 | Choi et al. |

FOREIGN PATENT DOCUMENTS

| KR | 101955328 B1 | 5/2019 |
| KR | 1020190072838 A | 6/2019 |

*Primary Examiner* — Donald L Raleigh
(74) *Attorney, Agent, or Firm* — Cantor Colburn LLP

(57) ABSTRACT

A display device includes a base substrate including a first folding portion, a first portion, and a second portion, a display element layer including first display elements, which are disposed on the first portion to emit a first light, and second display elements, which are disposed on the second portion to emit a second light, and a light control layer including a first region, which is disposed on the second portion and causes a first diffraction of the second light emitted from the second display elements, a second region, which guides the second light provided from the first region, and a third region, which is spaced apart from the first region with the second region interposed therebetween and emits the second light to an outside through a second diffraction of the second light.

20 Claims, 14 Drawing Sheets

DISPLAY DEVICE

This application claims priority to Korean Patent Application No. 10-2019-0130475, filed on Oct. 21, 2019, and all the benefits accruing therefrom under 35 U.S.C. § 119, the content of which in its entirety is herein incorporated by reference.

BACKGROUND

1. Field

Exemplary embodiments of the invention relate to a display device, and in particular, to a foldable display device.

2. Description of Related Art

Various display devices are being developed for use in multimedia devices, such as televisions, mobile phones, tablet computers, navigation systems, and gaming machines. A keyboard or a mouse is used as an input device of the display device. A recent display device generally includes an input-sensing layer that is used as an input device.

Recently, various display devices, which are different from a flat-panel display device and include various flexible display devices, such as curved, bendable, foldable, rollable, and stretchable display devices are being developed. In particular, a foldable display device, which is foldable along a folding axis, is being developed.

SUMMARY

Exemplary embodiments of the invention provide a display device which may display an image on its front and rear surfaces using a single display panel.

An exemplary embodiment of a display device may include a base substrate including a first folding portion folded along a first folding axis, a first portion adjacent to an end of the first folding portion, and a second portion adjacent to an opposite end of the first folding portion, the second portion having a planar area smaller than a planar area of the first portion and facing the first portion in a thickness direction, a display element layer including first display elements, which are disposed on the first portion and emit a first light, and second display elements, which are disposed on the second portion and emit a second light, and a light control layer including a first region, which is disposed on the second portion and causes a first diffraction of the second light emitted from the second display elements, a second region, which guides the second light provided from the first region, and a third region, which is spaced apart from the first region with the second region interposed therebetween and emits the second light to an outside through a second diffraction of the second light.

In an exemplary embodiment, the planar area of the second portion may be about 3 percent (%) to about 30% of the planar area of the first portion in a plan view.

In an exemplary embodiment, the first region may overlap the second portion, and the third region may does not overlap the second portion.

In an exemplary embodiment, the light control layer may further include a first light control layer which is disposed on the second display elements and emits a first sub-light, which is a first part of the second light within a first wavelength range, to the outside through the first diffraction and the second diffraction, a second light control layer which is disposed on the first light control layer and emits a second sub-light, which is a second part of the second light within a second wavelength range different from the first wavelength range, to the outside through the first diffraction and the second diffraction, and a third light control layer which is disposed on the second light control layer and emits a third sub-light, which is a third part of the second light within a third wavelength range different from the first and second wavelength ranges, to the outside through the first diffraction and the second diffraction.

In an exemplary embodiment, each of the first to third light control layers may include a first diffraction pattern which is disposed on the second portion and causes the first diffraction of a corresponding one of the first to third sub-lights, an optical waveguide which is disposed on the first diffraction pattern and guides the sub-light, which is diffracted by the first diffraction at the first diffraction pattern, and a second diffraction pattern which is spaced apart from the first diffraction pattern and causes the second diffraction of the sub-light provided from the optical waveguide.

In an exemplary embodiment, the first diffraction pattern and the second diffraction pattern may be disposed on a rear surface of the optical waveguide.

In an exemplary embodiment, the first diffraction pattern and the second diffraction pattern may be disposed in the optical waveguide.

In an exemplary embodiment, the optical waveguide may overlap the first to third regions.

In an exemplary embodiment, the display device may further include a fourth light control layer, which is disposed between the first light control layer and the second display elements and receives the second light. The fourth light control layer may be a collimator lens.

In an exemplary embodiment, a planar area of the third region may be larger than the planar area of the first region in a plan view.

In an exemplary embodiment, the first light emitted from the first display elements may be displayed to the outside through a first display surface corresponding to the first portion, and the second light emitted from the second display elements may be displayed to the outside through a second display surface corresponding to the third region.

In an exemplary embodiment, the first portion may include a second folding portion, which is folded along a second folding axis, and a first non-folding portion and a second non-folding portion, which is spaced apart from each other with the second folding portion interposed therebetween. The second non-folding portion may face the second portion corresponding to a third non-folding portion.

In an exemplary embodiment, the first portion may be operated in one of a first mode, in which the second folding portion is folded, and a second mode, in which the second folding portion is non-folded. In the second mode, the light control layer may overlap the second non-folding portion and may not overlap the first non-folding portion.

In an exemplary embodiment, the first mode may include an inward folding mode, in which only the second light is emitted from the second display elements, and an outward folding mode, in which only the first light is emitted from the first display elements.

In an exemplary embodiment, the display element layer may further include third display elements disposed on the first folding portion.

In an exemplary embodiment, the display device may further include an input-sensing layer disposed on the first portion.

An exemplary embodiment of a display device may include a display panel which includes a first folding portion, a first portion, which is adjacent to an end of the first folding portion and defines a first display surface, and a second portion, which is adjacent to an opposite end of the first folding portion and has a planar area smaller than a planar area of the first portion, and emits a first light through the first portion and a second light through the second portion, and a light control layer disposed on the display panel, the light control layer including a first region, which causes a first diffraction of the second light emitted from the second portion, a second region, which guides the second light provided from the first region, and a third region, which causes a second diffraction of the second light and defines a second display surface.

In an exemplary embodiment, the first portion may include a second folding portion, a first non-folding portion adjacent to an end of the second folding portion, and a second non-folding portion, which is adjacent to an opposite end of the second folding portion and faces the second portion. A planar area of the third region may be smaller than a planar area of the second non-folding portion.

In an exemplary embodiment, only one of the first and second display surfaces may display an image.

An exemplary embodiment of a display device may include a display panel including a folding region folded along a folding axis, a first light-emitting region adjacent to an end of the folding region, and a second light-emitting region adjacent to an opposite end of the folding region, the first light-emitting region which emits a first light and defining a first display surface, the second light-emitting region which overlaps the first light-emitting region, emits a second light, and has a planar area smaller than a planar area of the first light-emitting region, and a light control layer which defines a second display surface and emits the second light emitted from the second light-emitting region to an outside through diffraction. The second light may be emitted through the second display surface, when the first light-emitting region is in a folded state, and the first light may be emitted through the first display surface, when the first light-emitting region is in a non-folded state.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

DETAILED DESCRIPTION

Figure 1:
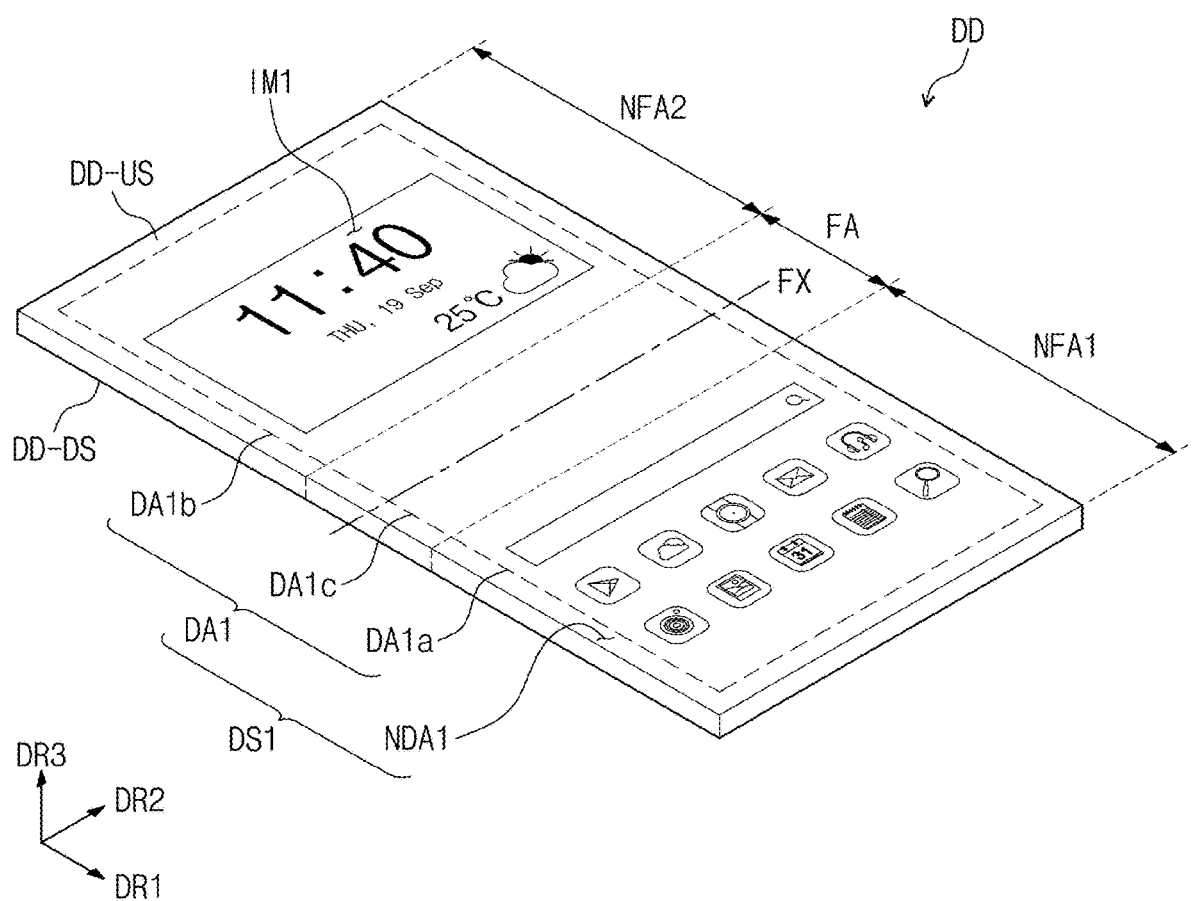
FIG. 1 is a perspective view illustrating an exemplary embodiment of a display device according to the invention.

Exemplary embodiments of the invention will now be described more fully with reference to the accompanying drawings, in which exemplary embodiments are shown. Exemplary embodiments of the invention may, however, be embodied in many different forms and should not be construed as being limited to the exemplary embodiments set forth herein; rather, these embodiments are provided so that this invention will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. If the device in the drawing figures is turned over, for example, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Exemplary embodiments of the invention are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which exemplary embodiments of the invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
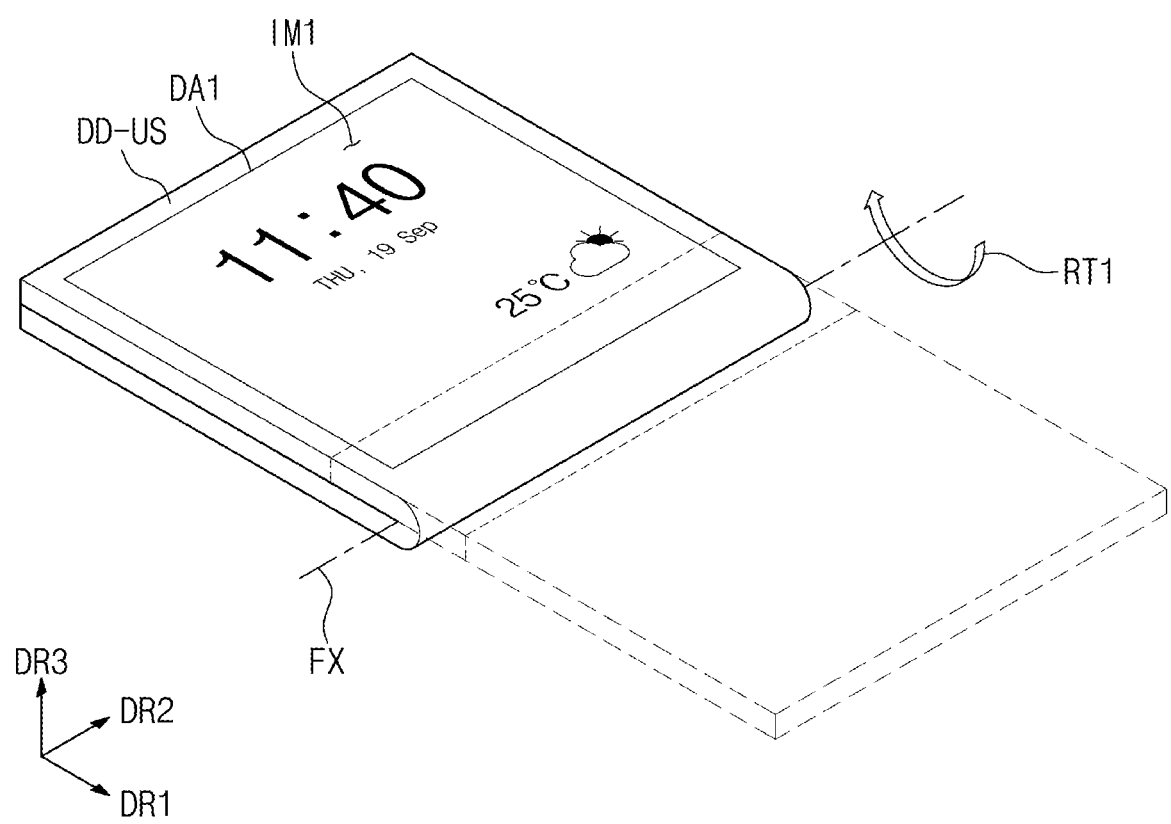
FIG. 2A is a perspective view illustrating an exemplary embodiment of a display device folded along a folding axis, according to the invention.
Figure 2B:
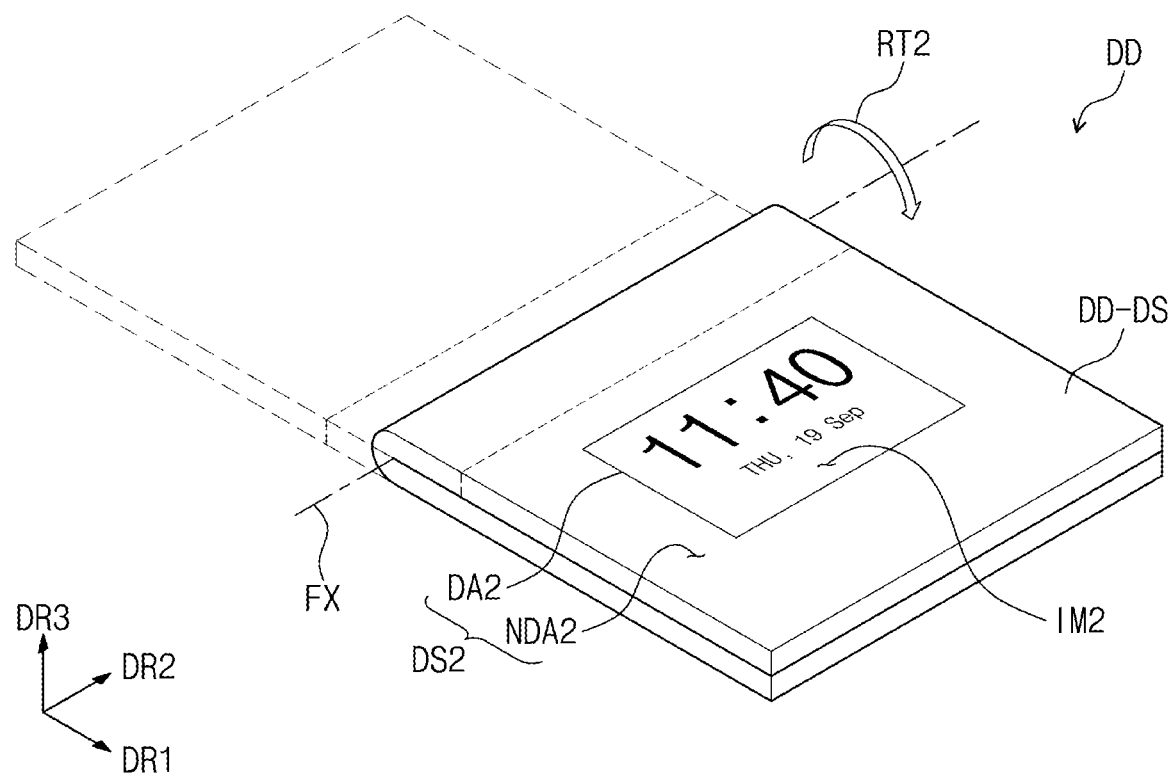
FIG. 2B is a perspective view illustrating an exemplary embodiment of a display device folded along a folding axis, according to the invention.

FIG. 1 is a perspective view illustrating an exemplary embodiment of a display device according to the invention. FIG. 2A is a perspective view illustrating a display device folded along a folding axis, according to the invention. FIG. 2B is a perspective view illustrating an exemplary embodiment of a display device folded along a folding axis, according to the invention.

A foldable display device DD (hereinafter, also referred to as a display device) is exemplarily illustrated, but the invention is not limited to this exemplary embodiment. In other exemplary embodiments, the invention may be applied to various display devices such as curved, bendable, rollable, and stretchable display devices, for example. Furthermore, the foldable display device DD may be used for large-sized electronic devices (e.g., television sets and outdoor billboards) or small- or medium-sized electronic devices (e.g., cellular phones, personal computers, laptop computers, personal digital assistants, car navigation systems, game machines, portable electronic devices, wristwatch-style electronic devices, and cameras).

Referring to FIG. 1, the display device DD may include a front surface DD-US defining a first display surface DS1 and a rear surface DD-DS defining a second display surface DS2 (e.g., refer to FIG. 2B). The first display surface DS1 may be divided into a first display region DA1 and a first non-display region NDA1, depending on whether a first image IM1 is displayed. The first display region DA1 may be a region, on which the first image IM1 is displayed, and the first non-display region NDA1 may not display the first image IM1.

In an exemplary embodiment, the display device DD may be a smart phone of a rectangular shape, as shown in FIG. 1, and the first display region DA1 may be used to display the first image IM1 including weather information and icons. However, the invention is not limited thereto, and the display device DD may have various other shapes. The first non-display region NDA1 may be provided near or around the first display region DA1 or may be omitted in another exemplary embodiment.

The first display surface DS1 may be parallel to a plane defined by a first direction DR1 and a second direction DR2. Hereinafter, a third direction DR3 will be used to indicate a normal direction of the display device DD. In the specification, the expression "in a plan view" may be used to describe a shape of an object viewed in the third direction DR3. Hereinafter, the third direction DR3 may be used to differentiate a front or top surface of each layer or unit from a back or bottom surface. However, directions indicated by the first to third directions DR1, DR2, and DR3 may be relative concept, and in an exemplary embodiment, they may be changed to other (e.g., opposite) directions.

In an exemplary embodiment, the first display surface DS1 may include a folding region FA, which may be folded along a folding axis FX, and a first non-folding region NFA1 and a second non-folding region NFA2, which are spaced apart from each other with the folding region FA interposed therebetween. The folding axis FX may be parallel to the second direction DR2. In a plan view, the first non-folding region NFA1 may be region adjacent to an edge of the folding region FA and may define a first sub-display region DA1a. The second non-folding region NFA2 may be a region adjacent to an opposite edge of the folding region FA and may define a second sub-display region DA1b. The folding region FA may define a third sub-display region DA1c.

The first to third sub-display regions DA1a to DA1c may be used to display a single image (e.g., the first image IM1). However, the invention is not limited to this exemplary embodiment, and in an exemplary embodiment, the first to third sub-display regions DA1a to DA1c may be separately operated to display different images.

In an exemplary embodiment, the display device DD may be folded in two different directions along the folding axis FX.

Referring to FIG. 2A, the folding region FA may be folded along the folding axis FX, such that the front surface DD-US of the display device DD is exposed to the outside. In this case, the folding region FA may be folded along a first rotating axis RT1, and thus, the front surface DD-US of the display device DD may be exposed to the outside.

Referring to FIG. 2B, the folding region FA may be folded along the folding axis FX, such that the rear surface DD-DS of the display device DD is exposed to the outside. In this case, the folding region FA may be folded along a second rotating axis RT2, and thus, the rear surface DD-DS of the display device DD may be exposed to the outside.

In an exemplary embodiment, the rear surface DD-DS of the display device DD may define the second display surface DS2. The second display surface DS2 may include a second display region DA2 and a second non-display region NDA2. A planar area of the second display surface DS2 may be smaller than a planar area of the first display surface DS1 of FIG. 1. In an exemplary embodiment, the planar area of the second display surface DS2 may be about 5% to about 50% of the planar area of the first display surface DS1, for example. Thus, the second display surface DS2 may have a smaller area than each of areas of the first and second non-folding regions NFA1 and NFA2.

In the following description, it will be described that the display device DD is in an outward folding state when the display device DD is folded along the folding axis FX in such a way that the front surface DD-US is exposed to the outside. In addition, it will be described that the display device DD is in an inward folding state when the display device DD is folded along the folding axis FX in such a way that the rear surface DD-DS is exposed to the outside.

In an exemplary embodiment, the display device DD may display the first image IM1 through the front surface DD-US and may display a second image IM2 through the rear surface DD-DS. In another exemplary embodiment, the display device DD may display an image through one of the front and rear surfaces DD-US and DD-DS. In an exemplary embodiment, in the case where the display device DD is in the outward folding state or a non-folding state, the first image IM1 may be displayed through the front surface DD-US, for example, but the second image IM2 may not be displayed. In the case where the display device DD is in the inward folding state, the second image IM2 may be displayed through the rear surface DD-DS but the first image IM1 may not be displayed.

Figure 3:
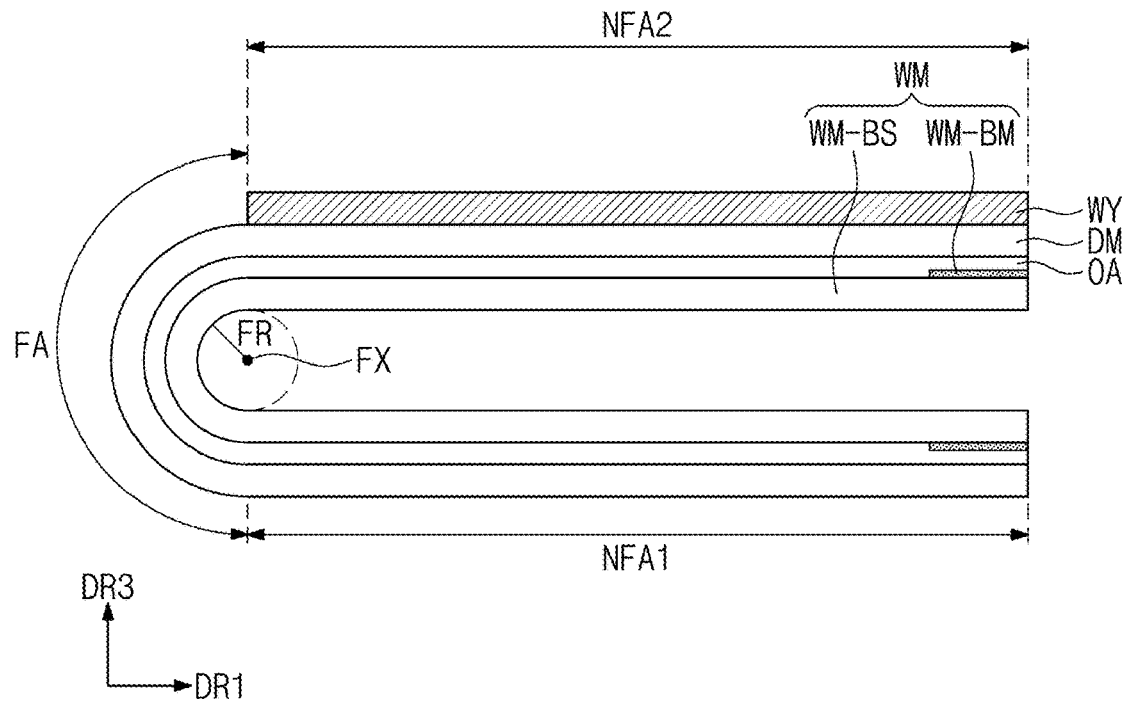
FIG. 3 is a cross-sectional view illustrating an exemplary embodiment of a folded display device according to the invention.

FIG. 3 is a cross-sectional view illustrating an exemplary embodiment of a folded display device according to the invention.

Referring to FIG. 3, the display device DD in the inward folding state is illustrated. In the case where the display device DD is in the inward folding state, an internal space may be defined in the display device DD, depending on a curvature radius FR. Although the following description will refer to an example, in which the internal space is defined when the display device DD is in the inward or outward folding state, the invention is not limited to this exemplary embodiment. In another exemplary embodiment, the internal space may not be defined, even when the display device DD is in the inward or outward folding state, for example.

In detail, the display device DD may include a display module DM, a window WM, an adhesive layer OA, and a light control layer WY. In an exemplary embodiment, each of the display module DM, the window WM, and the light control layer WY may consist of or include a flexible material.

The window WM may be disposed on the display module DM to define the front surface DD-US of the display device DD. The window WM may include a base layer WM-BS and a light-blocking layer WM-BM.

The base layer WM-BS may include a front surface and a rear surface. The front surface of the base layer WM-BS may correspond to the front surface DD-US of the display device DD. The light-blocking layer WM-BM may be disposed on the rear surface of the base layer WM-BS facing the display module DM to define the first non-display region NDA1 (e.g., refer to FIG. 1) of the display device DD. The base layer WM-BS may consist of or include at least one of glass, sapphire, or plastic materials and may be provided in the form of a film or substrate. The light-blocking layer WM-BM may be a colored organic layer and may be provided by, for example, a coating method. However, the invention is not limited to this exemplary embodiment, and in the case where the entire front surface of the display module DM is used as a display surface for displaying an image, the light-blocking layer WM-BM may be omitted in another exemplary embodiment.

The adhesive layer OA may be disposed between the rear surface of the window WM and the top surface of the display module DM to fix the window WM and the display module DM. In an exemplary embodiment, the adhesive layer OA may be provided in the form of an optically clear adhesive ("OCA") film.

The light control layer WY may be disposed on the rear surface of the display module DM. When the display device DD is inward or outward folded, the light control layer WY may overlap each of the first and second non-folding regions NFA1 and NFA2. When the display device DD is in the non-folding state, the light control layer WY may overlap the second non-folding region NFA2.

In an exemplary embodiment, the display device DD may display the first image IM1 (e.g., shown in FIG. 1) on the front surface DD-US using a first light output from the display module DM. In addition, the display device DD may display the second image IM2 (e.g., shown in FIG. 2B) on the rear surface DD-DS using a second light output from the light control layer WY. The light control layer WY may receive the second light from the display module DM and may display the second image IM2 using the second light. This will be described in more detail with reference to FIG. 6.

Figure 4:
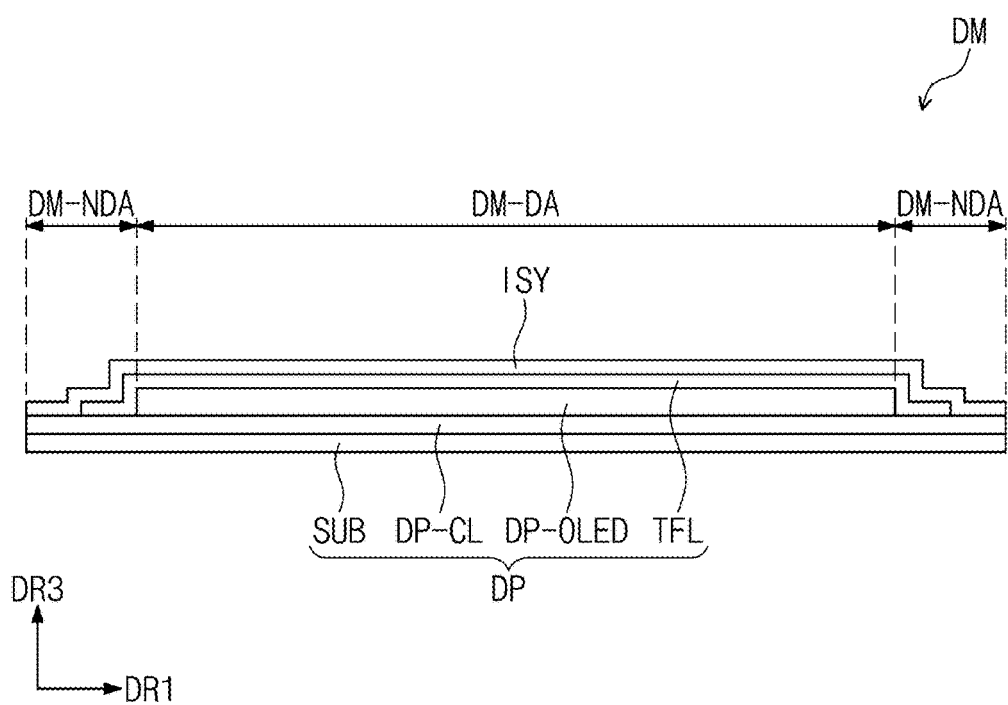
FIG. 4 is a cross-sectional view illustrating an exemplary embodiment of a display module according to the invention.

FIG. 4 is a cross-sectional view illustrating an exemplary embodiment of a display module according to the invention.

Referring to FIG. 4, the display module DM may include a display panel DP and an input-sensing layer ISY. The display module DM may include a display region DM-DA and a non-display region DM-NDA. The display region DM-DA of the display module DM may correspond to the first display region DA1 of FIG. 1. The non-display region DM-NDA of the display module DM may correspond to the first non-display region NDA1 of FIG. 1.

The display panel DP may be a light-emitting type display panel, but the invention is not limited to this exemplary embodiment. In an exemplary embodiment, the display panel DP may be an organic light-emitting display panel or a quantum dot light-emitting display panel, for example. The organic light-emitting display panel may include an organic light-emitting material which is used as a light-emitting layer. The quantum dot light-emitting display panel may include quantum dots and/or quantum rods, which are used as a light-emitting layer. Hereinafter, an example, in which the display panel DP is the organic light-emitting display panel, will be described.

The display panel DP may include a base substrate SUB and a circuit device layer DP-CL, a display element layer DP-OLED, and an insulating layer TFL, which are disposed on the base substrate SUB. The input-sensing layer ISY may be directly disposed on the insulating layer TFL. In the specification, the expression "an element A may be directly disposed on an element B" means that an adhesive layer is not disposed between the elements A and B.

The base substrate SUB may be a layer, which is used to support the circuit device layer DP-CL and the display element layer DP-OLED.

The circuit device layer DP-CL may include at least one intermediate insulating layer and at least one circuit device. In an exemplary embodiment, the intermediate insulating layer may include at least one intermediate inorganic layer and at least one intermediate organic layer. The circuit device may include signal lines, a pixel driving circuit, and so forth.

The display element layer DP-OLED may include a plurality of display elements emitting light. In an exemplary embodiment, the display elements may include organic light-emitting diodes, for example. The display element layer DP-OLED may further include an organic layer such as a pixel definition layer.

The insulating layer TFL may hermetically seal or encapsulate the display element layer DP-OLED. As an example, the insulating layer TFL may be a thin encapsulation layer. The insulating layer TFL may protect the display element layer DP-OLED from a contamination material, such as moisture, oxygen, and dust particles. In the exemplary embodiment of FIG. 4, the insulating layer TFL is illustrated to be overlapped with each of the display and non-display regions DM-DA and DM-NDA, but the invention is not limited to this exemplary embodiment. In another exemplary embodiment, the insulating layer TFL may not overlap the non-display region DM-NDA, for example.

Figure 5A:
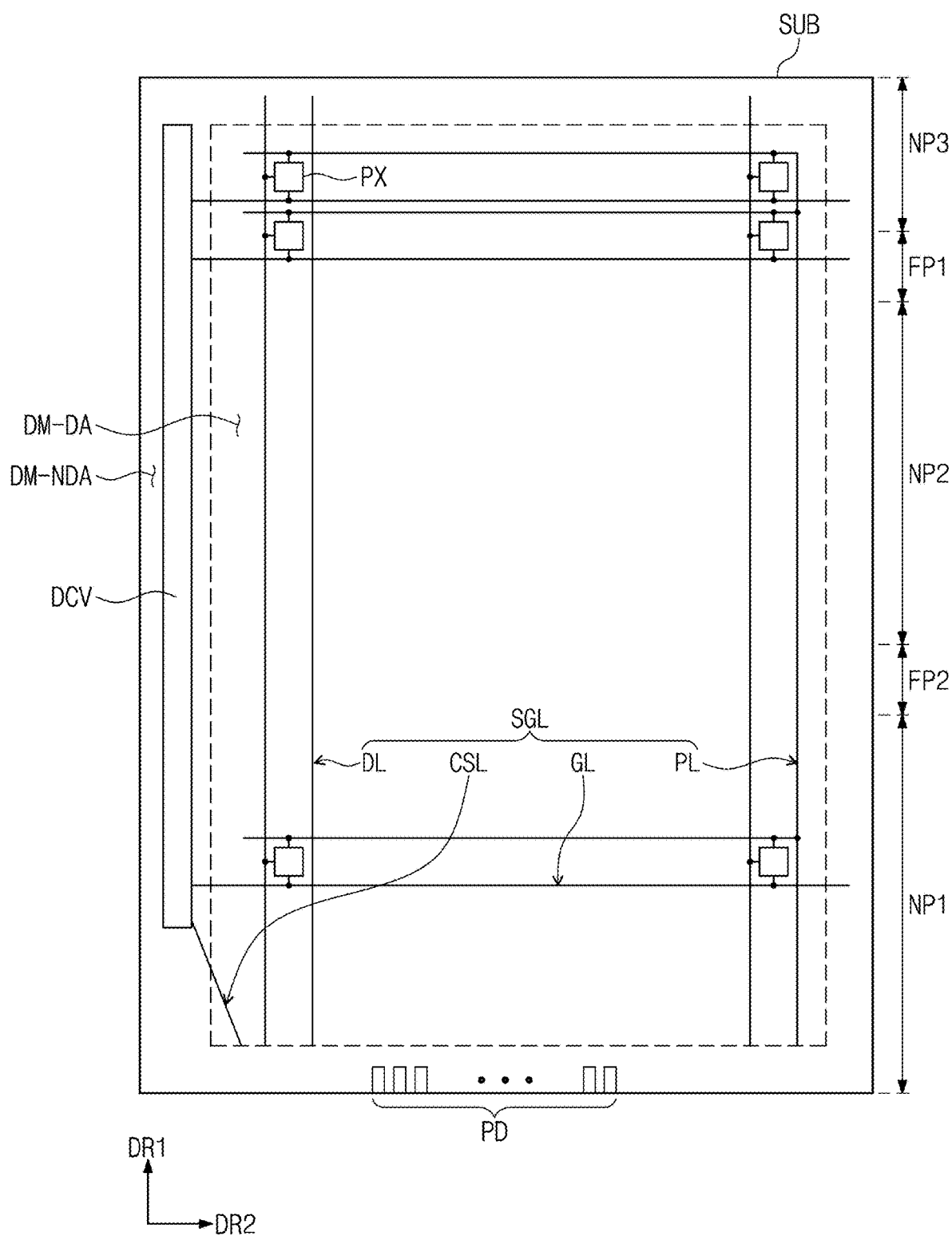
FIG. 5A is a plan view illustrating a display panel shown in FIG. 4.
Figure 5B:
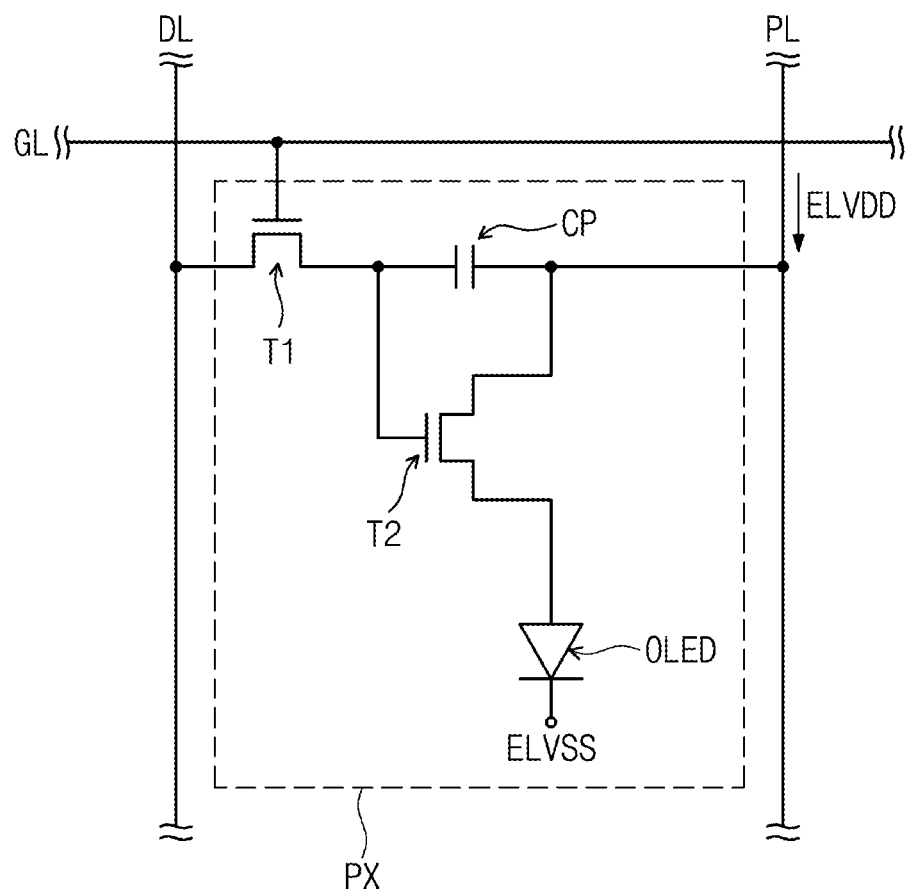
FIG. 5B is an equivalent circuit diagram illustrating a pixel shown in FIG. 5A.
Figure 5C:
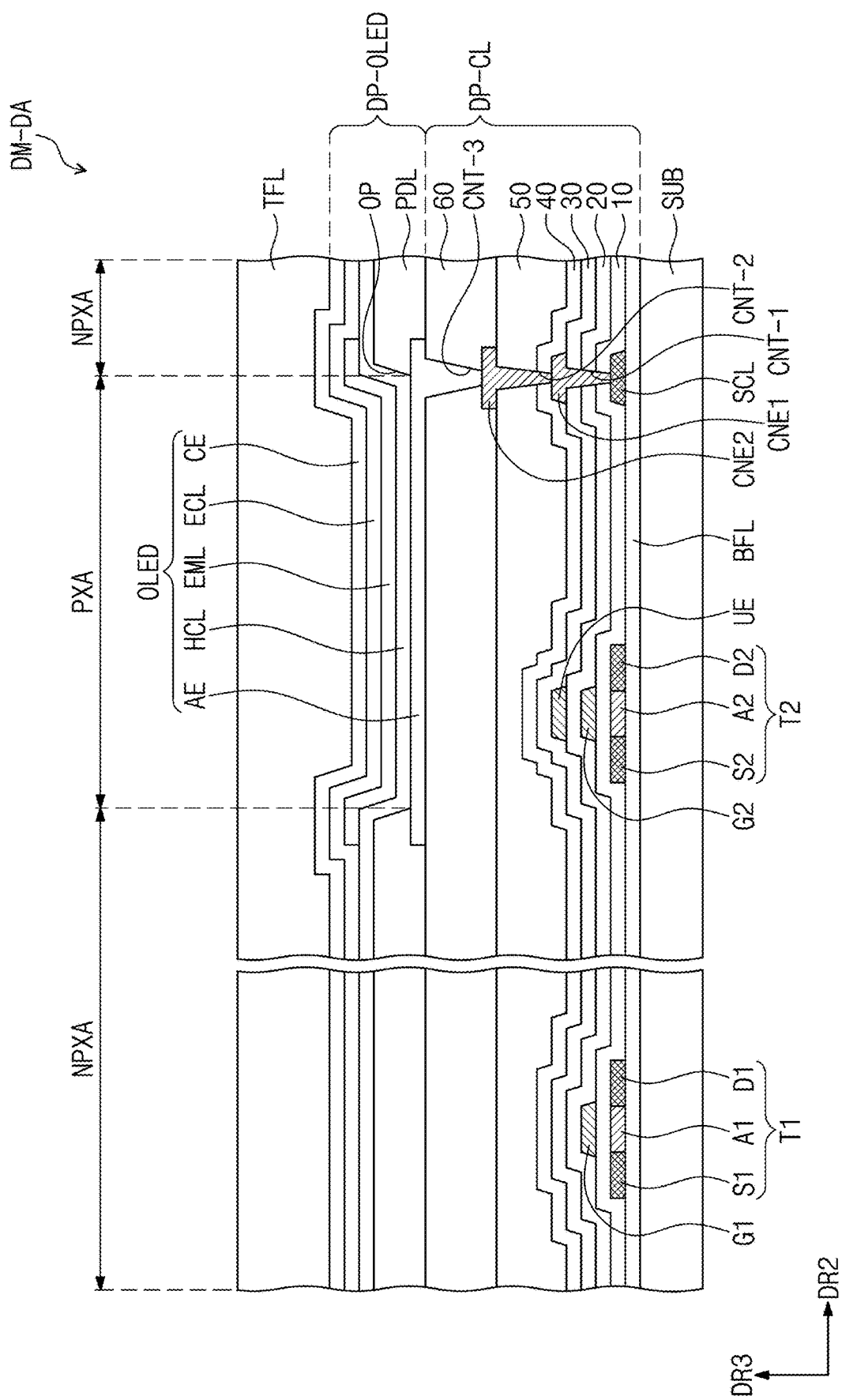
FIG. 5C is an enlarged cross-sectional view of an exemplary embodiment of a display panel according to the invention.

FIG. 5A is a plan view illustrating a display panel shown in FIG. 4. FIG. 5B is an equivalent circuit diagram illustrating a pixel shown in FIG. 5A. FIG. 5C is an enlarged cross-sectional view of an exemplary embodiment of a display panel according to the invention.

Referring to FIG. 5A, the display panel DP may include a driving circuit DCV, a plurality of signal lines SGL, a plurality of pixels PX, and a plurality of driving pads PD. The driving circuit DCV, the signal lines SGL, the pixels PX, and the driving pads PD may be disposed on the base substrate SUB.

A region, in which the pixels PX are displayed, will be defined as the display region DM-DA shown in FIG. 4. The driving circuit DCV, the signal lines SGL, and the pixel driving circuit controlling operations of the pixels PX may be included in the circuit device layer DP-CL of FIG. 4.

The driving circuit DCV may generate a plurality of scan signals and may sequentially output the scan signals a plurality of gate lines GL, which will be described below. In an exemplary embodiment, the driving circuit DCV may output additional control signals to the pixel driving circuit of the pixels PX.

The driving circuit DCV may include a plurality of thin film transistors, which are provided by the same process (e.g., a low temperature polycrystalline silicon ("LTPS") process or a low temperature polycrystalline oxide ("LTPO") process) as that for the pixel driving circuit of the pixels PX.

The signal lines SGL may include gate lines GL, data lines DL, a power line PL, and a control signal line CSL. Each of the gate lines GL may be connected to corresponding ones of the pixels PX, and each of the data lines DL may be connected to corresponding ones of the pixels PX. The power line PL may be connected to the plurality of the pixels PX. The driving circuit DCV, to which the gate lines GL are connected, may be disposed in the non-display region DM-NDA. The control signal line CSL may be used to provide the control signals to the driving circuit DCV.

Some of the gate lines GL, the data lines DL, the power line PL, and the control signal line CSL may be disposed in the same layer, and others may be disposed in another layer.

The display panel DP may include the driving pads PD overlapped with the non-display region DM-NDA. The driving pads PD may be electrically connected to the data lines DL, the power line PL, and the control signal line CSL. The driving pads PD may be used to provide driving signals to corresponding ones of the signal lines SGL.

Referring to FIG. 5B, each of the pixels PX may include an organic light-emitting diode OLED and a pixel driving circuit connected thereto.

In detail, the pixel PX may include a first transistor T1, a second transistor T2, a capacitor CP, and an organic light-emitting diode OLED. The pixel driving circuit may include at least a switching transistor and a driving transistor, but the invention is not limited to the exemplary embodiment shown in FIG. 5B. In the exemplary embodiments illustrated in FIG. 5B, the first and second transistor T1 and T2 are illustrated to be p-channel (+) metal-oxide-semiconductor ("PMOS") transistors, but in an exemplary embodiment, at least one of the first and second transistor T1 and T2 may be n-channel (−) metal-oxide-semiconductor ("NMOS") transistors.

The first transistor T1 may be connected to the gate line GL and the data line DL. The organic light-emitting diode OLED may receive a first power voltage ELVDD and a second power voltage ELVSS, which are provided through the power line PL. The first power voltage ELVDD may be provided to a first electrode of the organic light-emitting diode OLED through the second transistor T2, and the second power voltage ELVSS may be provided to a second electrode of the organic light-emitting diode OLED. The second power voltage ELVSS may be lower than the first power voltage ELVDD.

Referring to FIG. 5C, the display panel DP may include a plurality of insulating layers, a plurality of semiconductor patterns, a plurality of conductive patterns, and a plurality of signal lines. An insulating layer, a semiconductor layer, and a conductive layer may be provided by a coating or deposition process. Thereafter, the insulating layer, the semiconductor layer, and the conductive layer may be selectively patterned using a photolithography process. Semiconductor patterns, conductive patterns, and signal lines constituting the circuit device layer DP-CL and the display element layer DP-OLED may be provided by this method. The display panel DP of FIG. 5C may have an additional device, other than the first transistor T1 and the second transistor T2 described to constitute the pixel driving circuit of FIG. 5B. The base substrate SUB may support the circuit device layer DP-CL and the display element layer DP-OLED.

The base substrate SUB may include a synthetic resin film. The synthetic resin layer may include a thermosetting resin. The base substrate SUB may have a multi-layered structure. In an exemplary embodiment, the base substrate SUB may have a triple-layered structure including a synthetic resin layer, an adhesive layer, and a synthetic resin layer, for example. The synthetic resin layer may be a polyimide-based resin layer, and the invention is not limited to a specific material. In an exemplary embodiment, the synthetic resin layer may include at least one of acryl resins, methacryl resins, polyisoprene resins, vinyl resins, epoxy resins, urethane resins, cellulose resins, siloxane resins, polyamide resins, or perylene resins, for example. In an exemplary embodiment, the base substrate SUB may include a glass substrate, a metal substrate, or an organic/inorganic composite substrate.

At least one inorganic layer may be disposed on the front surface of the base substrate SUB. In an exemplary embodiment, the inorganic layer may consist of or include at least one of aluminum oxide, titanium oxide, silicon oxide, silicon oxynitride, zirconium oxide, or hafnium oxide, for example. The inorganic layer may be provided to have a multi-layered structure including a plurality of inorganic layers. The multi-layered inorganic layers may constitute a barrier layer and/or a buffer layer. As shown in the illustrated exemplary embodiment, the display panel DP may include a buffer layer BFL.

The buffer layer BFL may enhance an adhesive strength between the base substrate SUB and a semiconductor pattern. In an exemplary embodiment, the buffer layer BFL may include at least one silicon oxide layer and at least one silicon nitride layer, for example. The silicon oxide layer and the silicon nitride layer may be alternatingly stacked.

A semiconductor pattern may be disposed on the buffer layer BFL. In an exemplary embodiment, the semiconductor pattern may consist of or include polysilicon, for example. However, the invention is not limited to this exemplary embodiment, and the semiconductor pattern may consist of or include at least one of amorphous silicon or metal oxides.

FIG. 5C illustrates a portion of the semiconductor pattern, and the semiconductor pattern may further include another portion disposed on other region of the pixel PX in a plan view. In an exemplary embodiment, the semiconductor patterns may be arranged with a predetermined rules throughout the pixels PX. Electrical characteristics of the semiconductor pattern may be changed depending on its doping state. The semiconductor pattern may include a doped region and an undoped region. The doped region may be doped with n- or p-type dopants. A p-type transistor may include an impurity region doped with p-type dopants.

The doped region may have conductivity higher than the undoped region and may be used as an electrode or a signal line. The undoped region may correspond to an active or channel region of a transistor. In other words, a first portion of the semiconductor pattern may be used as the active region of the transistor, a second portion may be used as the source or drain electrode of the transistor, and a third portion may be used as a connection electrode or a connection signal line.

As shown in FIG. 5C, the first transistor T1 may include a source S1, an active A1, and a drain D1, each of which is a part of the semiconductor pattern, and the second transistor T2 may include a source S2, an active A2, and a drain D2, each of which is a part of the semiconductor pattern. The sources S1 and S2 and the drains D1 and D2 may be extended from the actives A1 and A2 in opposite directions in a cross-section view. FIG. 5C illustrates a portion of a connection signal line SCL provided from the semiconductor pattern. Although not shown, the connection signal line SCL may be connected to the drain D2 of the second transistor T2 in a plan view.

A first insulating layer 10 may be disposed on the buffer layer BFL. The first insulating layer 10 may overlap all of the pixels PX and may cover the semiconductor pattern. The first insulating layer 10 may be an inorganic layer and/or an organic layer and may have a single- or multi-layered structure. In an exemplary embodiment, the first insulating layer 10 may consist of or include at least one of aluminum oxide, titanium oxide, silicon oxide, silicon oxynitride, zirconium oxide, or hafnium oxide, for example. In the illustrated exemplary embodiment, the first insulating layer 10 may be a single-layered silicon oxide layer. The first insulating layer 10 as well as an insulating layer of the circuit device layer DP-CL to be described below may be an inorganic layer and/or an organic layer and may have a single- or multi-layered structure. The inorganic layer may consist of or include at least one of the above materials.

Gates G1 and G2 may be disposed on the first insulating layer 10. Each of the gates G1 and G2 may be a portion of a metal pattern. The gates G1 and G2 may overlap the actives A1 and A2. In an exemplary embodiment, the gates G1 and G2 may be used as a doping mask in a process of doping the semiconductor pattern.

A second insulating layer 20 may be disposed on the first insulating layer 10 to cover the gates G1 and G2. The second insulating layer 20 may overlap all of the pixels PX. The second insulating layer 20 may be an inorganic layer and/or an organic layer and may have a single- or multi-layered structure. In the illustrated exemplary embodiment, the second insulating layer 20 may be a single-layered silicon oxide layer.

An upper electrode UE may be placed on the second insulating layer 20. The upper electrode UE may overlap the gate G2 of the second transistor T2. The upper electrode UE may be a portion of a metal pattern. A portion of the gate G2 and the upper electrode UE overlapped therewith may define the capacitor CP (e.g., refer to FIG. 5B).

A third insulating layer 30 may be disposed on the second insulating layer 20 to cover the upper electrode UE. In the illustrated exemplary embodiment, the third insulating layer 30 may be a single-layered silicon oxide layer. A first connection electrode CNE1 may be disposed on the third insulating layer 30. The first connection electrode CNE1 may be coupled to the connection signal line SCL through a contact hole CNT-1 penetrating the first to third insulating layers 10 to 30.

A fourth insulating layer 40 may be disposed on the third insulating layer 30 to cover the first connection electrode CNE1. The fourth insulating layer 40 may be a single-layered silicon oxide layer. A fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be coupled to the first connection electrode CNE1 through a contact hole CNT-2 penetrating the fourth insulating layer 40 and the fifth insulating layer 50.

A sixth insulating layer 60 may be disposed on the fifth insulating layer 50 to cover the second connection electrode CNE2. The sixth insulating layer 60 may be an organic layer. A first electrode AE may be disposed on the sixth insulating layer 60. The first electrode AE may be connected to the second connection electrode CNE2 through a contact hole CNT-3 penetrating the sixth insulating layer 60. An opening OP may be defined in a pixel definition layer PDL. The opening OP of the pixel definition layer PDL may expose at least a portion of the first electrode AE.

As shown in FIG. 5C, a display region DP-DA may include a light-emitting region PXA and a light-blocking region NPXA adjacent to the light-emitting region PXA. The light-blocking region NPXA may enclose the light-emitting region PXA. In the illustrated exemplary embodiment, the light-emitting region PXA may be defined to correspond to a region of the first electrode AE exposed by the opening OP.

A hole control layer HCL may be disposed in both of the light-emitting region PXA and the light-blocking region NPXA. The hole control layer HCL may include a hole transport layer and, in an exemplary embodiment, the hole control layer HCL may further include a hole injection layer. A light-emitting layer EML may be disposed on the hole control layer HCL. The light-emitting layer EML may be disposed in a region corresponding to the opening OP. In other words, the light-emitting layer EML may be provided to include a plurality of portions, which are respectively disposed in the pixels.

An electron control layer ECL may be disposed on the light-emitting layer EML. The electron control layer ECL may include an electron transport layer and, in an exemplary embodiment, the electron control layer ECL may further include an electron injection layer. The hole control layer HCL and the electron control layer ECL may be provided using an open mask, and thus, the hole control layer HCL and the electron control layer ECL may be provided in common on a plurality of pixels. A second electrode CE may be disposed on the electron control layer ECL. The second electrode CE may be a single pattern which is disposed in all of the pixels PX.

Referring back to FIG. 5A, the base substrate SUB in an exemplary embodiment of the invention may include first to third non-folding portions NP1, NP2, and NP3, a first folding portion FP1, and a second folding portion FP2. The first non-folding portion NP1 and the second non-folding portion NP2 may correspond to the first and second non-folding regions NFA1 and NFA2, respectively, shown in FIG. 1. The second folding portion FP2 may correspond to the folding region FA of FIG. 1.

The first folding portion FP1 may be disposed between the second non-folding portion NP2 and the third non-folding portion NP3 and may be folded along a first folding axis. The second folding portion FP2 may be disposed between the first and second non-folding portions NP1 and NP2 and may be folded along a second folding axis. Each of the first folding axis and the second folding axis may correspond to the folding axis FX of FIG. 1.

In an exemplary embodiment, the second folding portion FP2 may be operated in both of the folding and non-folding modes, but the first folding portion FP1 may be operated in only the folding mode. In other words, the shape of the second folding portion FP2 may be changed by control from the outside, but the first folding portion FP1 may have a fixed shape.

The second and third non-folding portions NP2 and NP3 may be connected through the first folding portion FP1 to face each other in the thickness direction or in the third direction DR3. In a plan view, the third non-folding portion NP3 may have an area smaller than an area of the second non-folding portion NP2.

In the following specification, the first non-folding portion NP1, the second non-folding portion NP2, and the second folding portion FP2 may be defined as a first portion of the base substrate SUB, and the third non-folding portion NP3 may be defined as a second portion of the base substrate SUB. The first portion of the base substrate SUB may be adjacent to an end of the first folding portion FP1, and the second portion of the base substrate SUB may be adjacent to an opposite end of the first folding portion FP1. In a plan view, an area of the second portion of the base substrate SUB may be about 3% to about 30% of the area of the first portion, for example.

The display device DD may display the first image IM1 on the first display surface DS1 of FIG. 1, using a first light emitted from first display elements corresponding to the first portion of the base substrate SUB. The first image IM1 may be displayed to the outside through the front surface DD-US of the display device DD. In this case, the display device DD may be in the non-folding mode, in which the second folding portion FP2 is not folded, or in the outward folding state, in which the front surface DD-US is exposed to the outside.

In addition, the display device DD may display the second image IM2 on the second display surface DS2 of FIG. 2B, using a second light emitted from second display elements corresponding to the second portion of the base substrate SUB. The second image IM2 may be displayed to the outside through the rear surface DD-DS of the display device DD. The second light emitted from the second display elements may be provided to the light control layer WY of FIG. 3, and the second image IM2 may be displayed to the outside through the light control layer WY. In this case, the display device DD may be in the inward folding state; that is, the rear surface DD-DS may be exposed to the outside.

According to an exemplary embodiment of the invention, the image may be displayed on only one of the first and second display surfaces DS1 and DS2, as described above.

Figure 6:
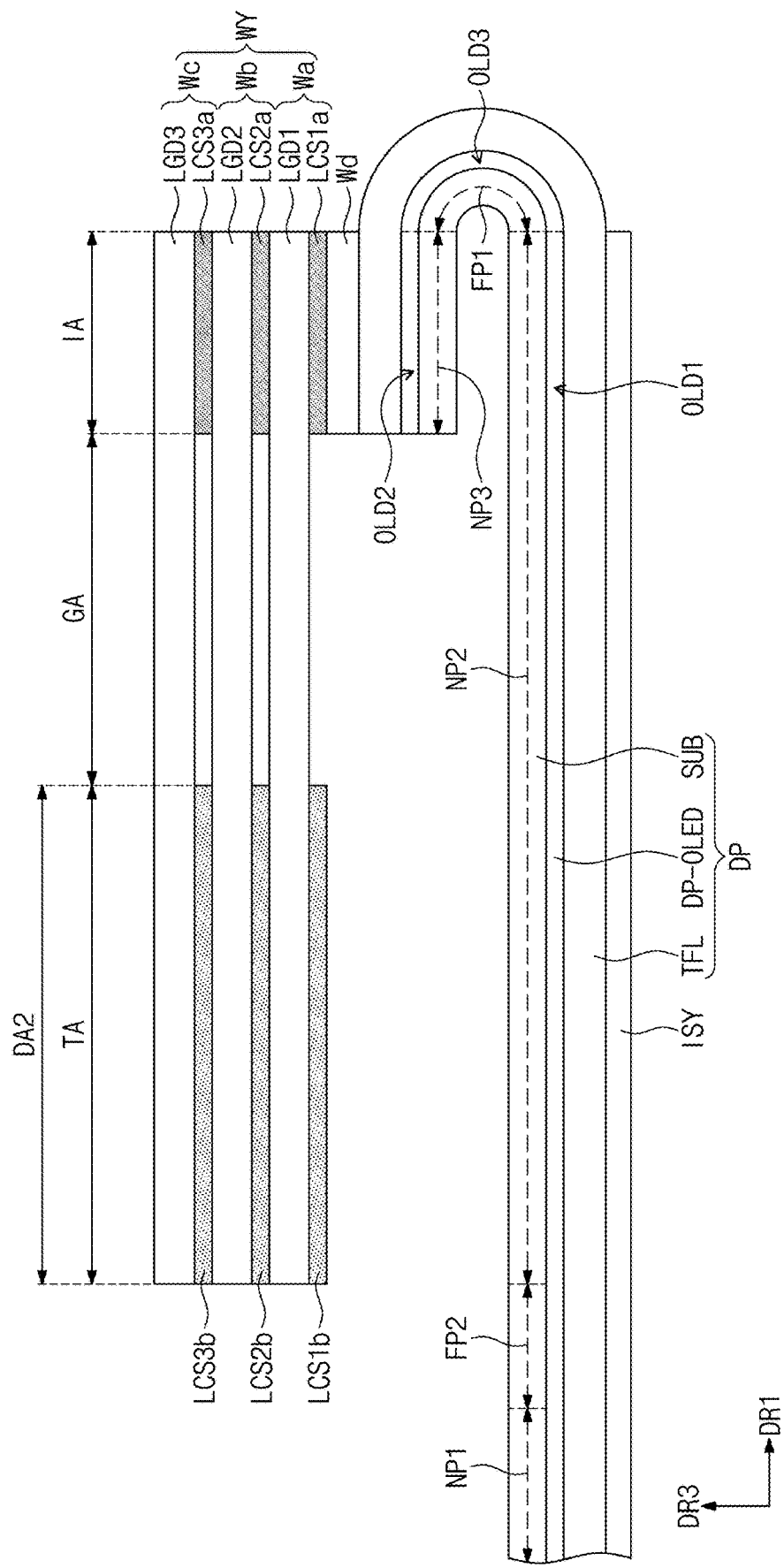
FIG. 6 is a cross-sectional view illustrating a display device according to the invention.
Figure 7:
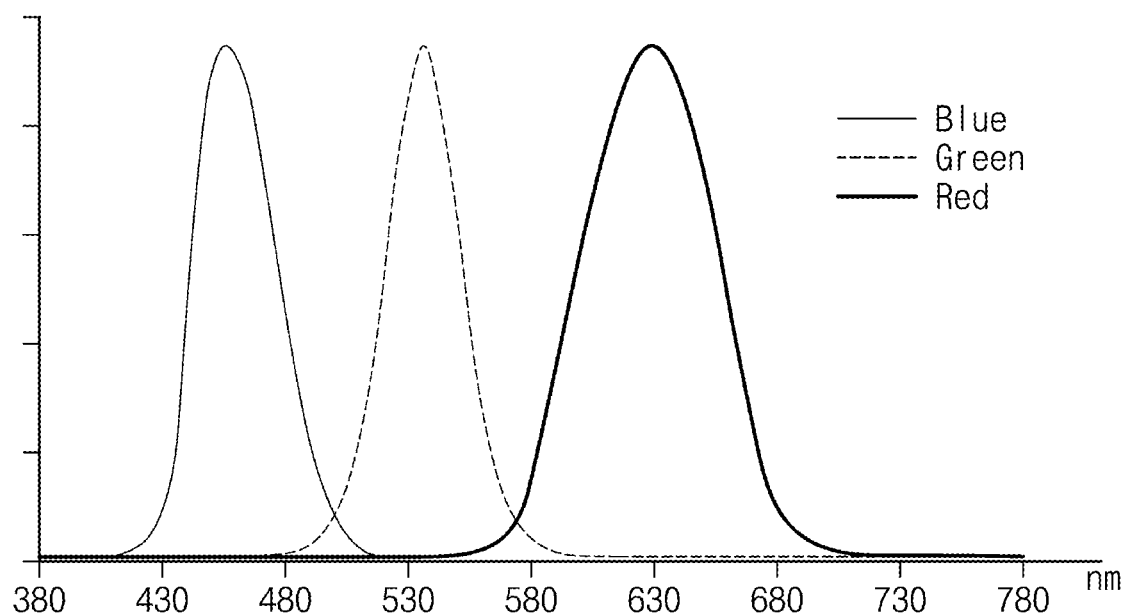
FIG. 7 is a graph showing wavelength ranges of three different lights.

FIG. 6 is a cross-sectional view illustrating an exemplary embodiment of a display device according to the invention. FIG. 7 is a graph showing wavelength ranges of three different lights.

Referring to FIG. 6, the first folding portion FP1 of the base substrate SUB may be fixed in a folded state. Since the first folding portion FP1 is folded, the third non-folding portion NP3 may face the second non-folding portion NP2 in the third direction DR3.

In an exemplary embodiment, the entire region of the third non-folding portion NP3 may overlap the second non-folding portion NP2, for example. The second folding portion FP2 may be changed to one of the non-folding state or the folding state, and the second folding portion FP2 in the non-folding state is illustrated in FIG. 6. In other words, the first non-folding portion NP1, the second folding portion FP2, and the second non-folding portion NP2 may provide a single plane.

The display element layer DP-OLED may include first display elements OLD1, second display elements OLD2, and third display elements OLD3. The first display elements OLD1 may be disposed on the first non-folding portion NP1, the second non-folding portion NP2, and the second folding portion FP2 corresponding to the first portion of the base substrate SUB. The first display elements OLD1 may emit the first light.

The second display elements OLD2 may be disposed on the third non-folding portion NP3 corresponding to the second portion of the base substrate SUB. The second display elements OLD2 may emit the second light. In an exemplary embodiment, since a planar area of the first portion of the base substrate SUB is larger than a planar area of the second portion, the number of the second display elements OLD2 may be also be smaller than the number of the first display elements OLD1.

The third display elements OLD3 may be disposed on the first folding portion FP1. Light emitted from the third display elements OLD3 may not be recognized by a user. However, the invention is not limited to this exemplary embodiment, and light emitted from the third display elements OLD3 may be provided to a user through a side surface of the display device DD. In other exemplary embodiments, the third display elements OLD3 may be omitted.

The light control layer WY may be disposed on the insulating layer TFL overlapped with the third non-folding portion NP3. In other words, due to the first folding portion FP1, the light control layer WY may be disposed on the rear surface of the base substrate SUB corresponding to the first portion and may be disposed on the top surface of the base substrate SUB corresponding to the second portion. The light control layer WY may emit the second image IM2 to the outside, using the second light emitted from the second display elements OLD2.

In an exemplary embodiment, the light control layer WY may be divided into first to third regions IA, GA, and TA. The second region GA may be disposed between the first region IA and the third region TA. The first region IA may correspond to the third non-folding portion NP3, and the second region GA and the third region TA may do not overlap the third non-folding portion NP3 and may overlap the second non-folding portion NP2. Although not shown, in the case where the second folding portion FP2 is folded in the inward or outward folding manner, the light control layer WY may overlap each of the first and second non-folding portions NP1 and NP2.

The first region IA may diffract the second light emitted from the second display elements OLD2 (hereinafter, first diffraction). The first diffraction may occur in such a way that the second light incident into the first region IA is guided to the second region GA. The second region GA may transfer the second light, which is provided from the first region IA, to the third region TA in a guided manner. The third region TA may diffract the second light, which is provided from the second region GA (hereinafter, second diffraction). The second diffraction may occur in such a way that the second light incident into the third region TA is emitted to the outside through the second display region DA2 of FIG. 2B.

In an exemplary embodiment, a planar area of the third region TA may be smaller than a planar area of the first non-folding portion NP1 or the second non-folding portion NP2.

In detail, the light control layer WY may include a first light control layer Wa, a second light control layer Wb, a third light control layer Wc, and a sub-light control layer Wd.

The sub-light control layer Wd may be disposed between the insulating layer TFL and the first light control layer Wa, which correspond to the third non-folding portion NP3. As an example, the sub-light control layer Wd may serve as a collimator lens changing the second light, which is emitted from the second display elements OLD2, to a collimated or parallel ray. In the specification, the sub-light control layer Wd will be referred to as a fourth light control layer.

The first light control layer Wa may include a first diffraction pattern LCS1a, a second diffraction pattern LCS1b, and a first optical waveguide LGD1. The first to third regions IA, GA, and TA of the light control layer WY described above may be defined by the first optical waveguide LGD1 or by second and third optical waveguides LGD2 and LGD3 to be described below.

The first diffraction pattern LCS1a may be disposed between the first optical waveguide LGD1 and the sub-light control layer Wd, which are overlapped with the first region IA. The first diffraction pattern LCS1a may cause the first diffraction of the second light, which is emitted from the sub-light control layer Wd.

In an exemplary embodiment, the first diffraction pattern LCS1a may guide a first sub-light, which is a part of the second light and has a wavelength within a first wavelength range, into the first optical waveguide LGD1 through diffraction, whereas the remaining part of the second light may pass through the first diffraction pattern LCS1a. As a result, the first sub-light, which is diffracted by the first diffraction pattern LCS1a, may propagate toward the second region GA (e.g., in the first direction DR1) through the first optical waveguide LGD1. In an exemplary embodiment, the first sub-light within the first wavelength range may correspond to the red light of FIG. 7, for example.

The second diffraction pattern LCS1b may correspond to the third region TA and may be spaced apart from the first diffraction pattern LCS1a with the second region GA interposed therebetween. The second diffraction pattern LCS1b may cause the second diffraction of the first sub-light guided through the first optical waveguide LGD1. As a result, the first sub-light diffracted by the second diffraction pattern LCS1b may be displayed to the outside through the second display region DA2.

In an exemplary embodiment, a planar area of the second diffraction pattern LCS1b may be larger than a planar area of the first diffraction pattern LCS1a.

The first optical waveguide LGD1 may correspond to each of the first to third regions IA, GA, and TA. The first diffraction pattern LCS1a and the second diffraction pattern LCS1b may be disposed on the rear surface of the first optical waveguide LGD1 facing the base substrate SUB. The first optical waveguide LGD1 may be provided such that the first sub-light incident from the first diffraction pattern LCS1a is guided through the total reflection and is emitted to the outside through the second diffraction pattern LCS1b.

The second light control layer Wb may include a third diffraction pattern LCS2a, a fourth diffraction pattern LCS2b, and the second optical waveguide LGD2. The third diffraction pattern LCS2a may be disposed between the first optical waveguide LGD1 and the second optical waveguide LGD2 corresponding to the first region IA.

In an exemplary embodiment, the third diffraction pattern LCS2a may cause the first diffraction of a second sub-light, which is a part of the second light passing through the first diffraction pattern LCS1a and has a wavelength within a second wavelength range, whereas the remaining part of the second light may pass through the third diffraction pattern LCS2a. In other words, the second sub-light may be guided to the second optical waveguide LGD2 by the diffraction at the third diffraction pattern LCS2a.

As a result, the second sub-light, which is diffracted by the third diffraction pattern LCS2a, may propagate toward the second region GA (e.g., in the first direction DR1) through the second optical waveguide LGD2. In an exemplary embodiment, the second sub-light within the second wavelength range may correspond to the green light of FIG. 7, for example.

The fourth diffraction pattern LCS2b may correspond to the third region TA and may be spaced apart from the third diffraction pattern LCS2a with the second region GA interposed therebetween. The fourth diffraction pattern LCS2b may cause the second diffraction of the second sub-light guided through the second optical waveguide LGD2. As a result, the second sub-light diffracted by the fourth diffraction pattern LCS2b may be displayed to the outside through the second display region DA2.

In an exemplary embodiment, a planar area of the fourth diffraction pattern LCS2b may be larger than a planar area of the third diffraction pattern LCS2a. In an exemplary embodiment, the planar area of the fourth diffraction pattern LCS2b may be substantially equal to the planar area of the second diffraction pattern LCS1b, and the planar area of the third diffraction pattern LCS2a may be substantially equal to a planar area of the first diffraction pattern LCS1a, for example.

The second optical waveguide LGD2 may correspond to each of the first to third regions IA, GA, and TA and may correspond to the first optical waveguide LGD1. The third diffraction pattern LCS2a and the fourth diffraction pattern LCS2b may be disposed on the top surface of the first optical waveguide LGD1 and the rear surface of the second optical waveguide LGD2. The second optical waveguide LGD2 may cause the total reflection of the second sub-light, which is incident from the third diffraction pattern LCS2a, and in this case, the second sub-light may be guided from the third diffraction pattern LCS2a to the fourth diffraction pattern LCS2b and may be emitted to the outside.

The third light control layer We may include a fifth diffraction pattern LCS3a, a sixth diffraction pattern LCS3b, and the third optical waveguide LGD3. The fifth diffraction pattern LCS3a may be disposed between the second optical waveguide LGD2 and the third optical waveguide LGD3 corresponding to the first region IA.

In detail, the fifth diffraction pattern LCS3a may cause the first diffraction of a third sub-light, which is a part of the second light passing through the third diffraction pattern LCS2a and has a wavelength within a third wavelength range. In other words, the third sub-light may be guided to the third optical waveguide LGD3 by the diffraction at the fifth diffraction pattern LCS3a.

Accordingly, the third sub-light, which is diffracted by the fifth diffraction pattern LCS3a, may propagate toward the second region GA (e.g., in the first direction DR1) through the third optical waveguide LGD3. In an exemplary embodiment, the third sub-light within the third wavelength range may correspond to the blue light of FIG. 7, for example.

The sixth diffraction pattern LCS3b may correspond to the third region TA and may be spaced apart from the fifth diffraction pattern LCS3a with the second region GA interposed therebetween. The sixth diffraction pattern LCS3b may cause the second diffraction of the third sub-light guided through the third optical waveguide LGD3. As a result, the third sub-light diffracted by the sixth diffraction pattern LCS3b may be displayed to the outside through the second display region DA2.

In an exemplary embodiment, a planar area of the sixth diffraction pattern LCS3b may be larger than a planar area of the fifth diffraction pattern LCS3a. In an exemplary embodiment, the planar area of the sixth diffraction pattern LCS3b may be substantially equal to the planar area of the second diffraction pattern LCS1b, and the planar area of the fifth diffraction pattern LCS3a may be substantially equal to the planar area of the first diffraction pattern LCS1a, for example.

In an exemplary embodiment, each of the first to sixth diffraction patterns LCS1a-LCS3a and LCS1b-LCS3b may consist of or include at least one of a diffraction optical element ("DOE"), a hologram optical element ("HOE"), a micro mirror, a mirror array, a polarization selective coating, or a prism, for example.

In addition, the first diffraction pattern LCS1a, the third diffraction pattern LCS2a, and the fifth diffraction pattern LCS3a may have different structures so as to cause diffraction of lights of respective wavelength ranges. The second diffraction pattern LCS1b, the fourth diffraction pattern LCS2b, and the sixth diffraction pattern LCS3b may have different structures so as to cause diffraction of lights of respective wavelength ranges.

In an exemplary embodiment, the first and second diffraction patterns LCS1a and LCS1b to diffract the first sub-light may have different structures from each other or the same structure as each other. The third and fourth diffraction patterns LCS2a and LCS2b to diffract the second sub-light may have different structures from each other or the same structure as each other. The fifth and sixth diffraction patterns LCS3a and LCS3b to diffract the third sub-light may have different structures from each other or the same structure as each other.

The third optical waveguide LGD3 may correspond to each of the first to third regions IA, GA, and TA and may correspond to the first optical waveguide LGD1. The fifth diffraction pattern LCS3a and the sixth diffraction pattern LCS3b may be disposed on the top surface of the second optical waveguide LGD2 and the rear surface of the third optical waveguide LGD3. The third optical waveguide LGD3 may cause the total reflection of the third sub-light, which is incident from the fifth diffraction pattern LCS3a, and in this case, the third sub-light may be guided from the fifth diffraction pattern LCS3a to the sixth diffraction pattern LCS3b and may be emitted to the outside.

The input-sensing layer ISY may be disposed on the first portion of the base substrate SUB. Since the input-sensing layer ISY is disposed on the first portion, an external input may be sensed through the front surface DD-US of the display device DD. Although not shown, the input-sensing layer ISY may also be disposed on the second portion of the base substrate SUB.

According to an exemplary embodiment of the invention, the display device DD may display an image on both of the front and rear surfaces DD-US and DD-DS using just one display panel (e.g., the display panel DP), as described above. In an exemplary embodiment, the display device DD may display a first image on the front surface DD-US using the first light emitted from the first display elements OLD1 and may display a second image on the rear surface DD-DS using the light control layer WY controlling a propagation path of the second light emitted from the second display elements OLD2, for example.

Since the single display panel is used to display an image on each of the front and rear surfaces, it may be possible to reduce a total fabrication cost of the display device.

Figure 8:
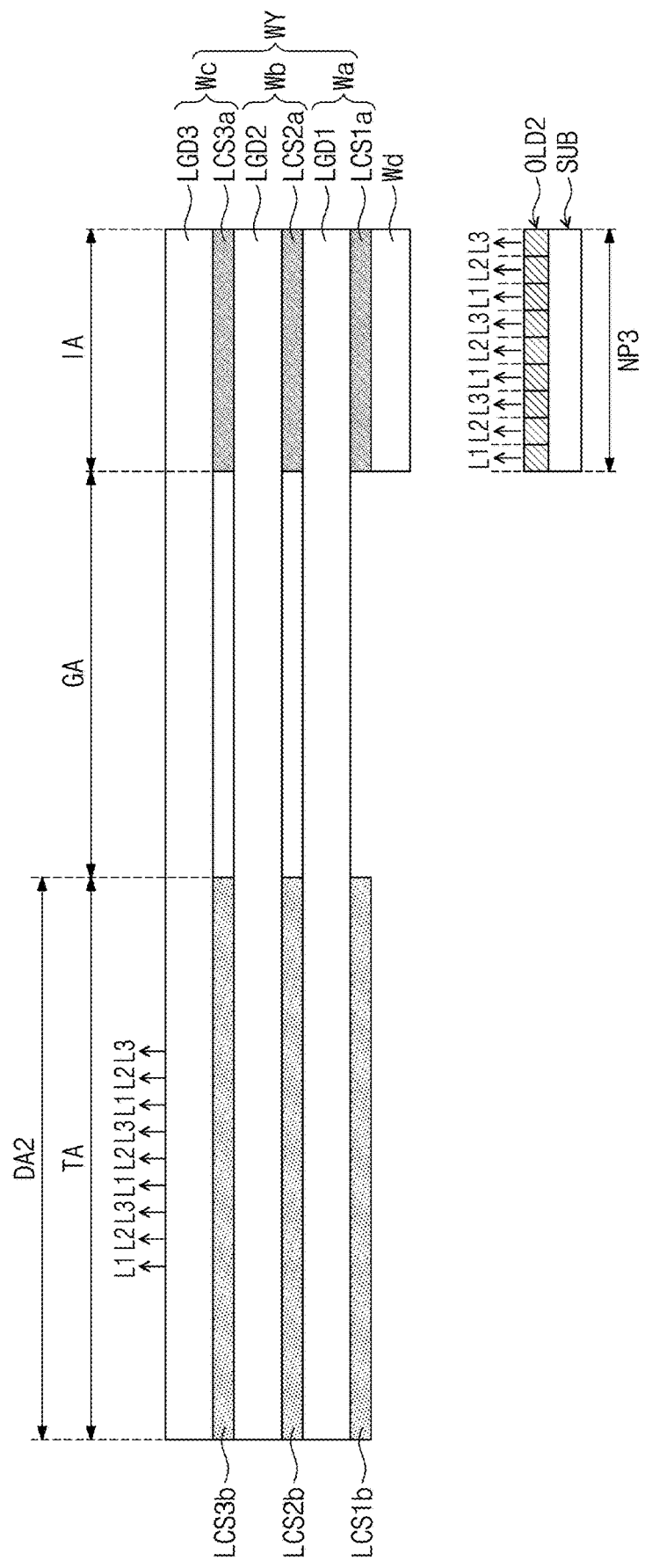
FIG. 8 is a cross-sectional view illustrating an exemplary embodiment of a light control layer according to the invention.
Figure 9A:
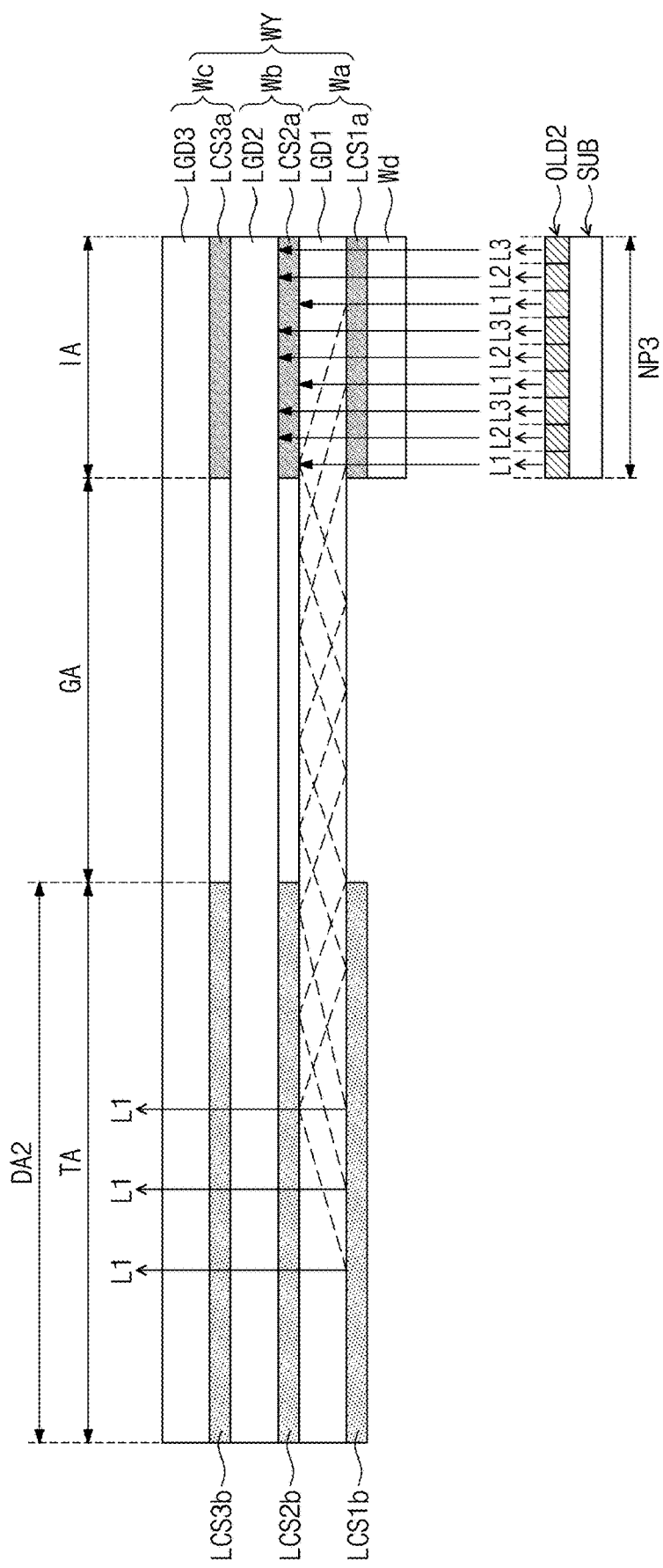
FIG. 9A is a cross-sectional view illustrating an exemplary embodiment of a light control layer, which is used to control a propagation path of a first light, according to the invention.
Figure 9B:
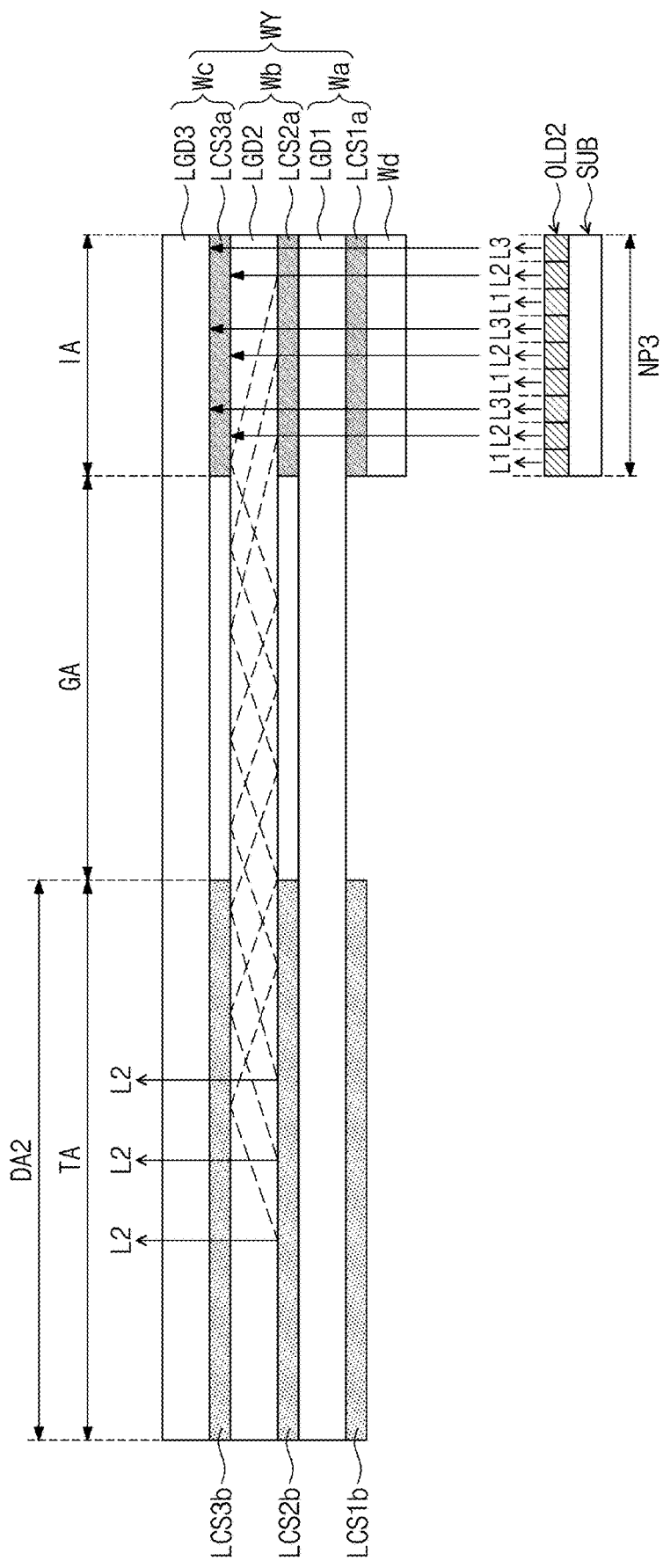
FIG. 9B is a cross-sectional view illustrating an exemplary embodiment of a light control layer, which is used to control a propagation path of a second light, according to the invention.
Figure 9C:
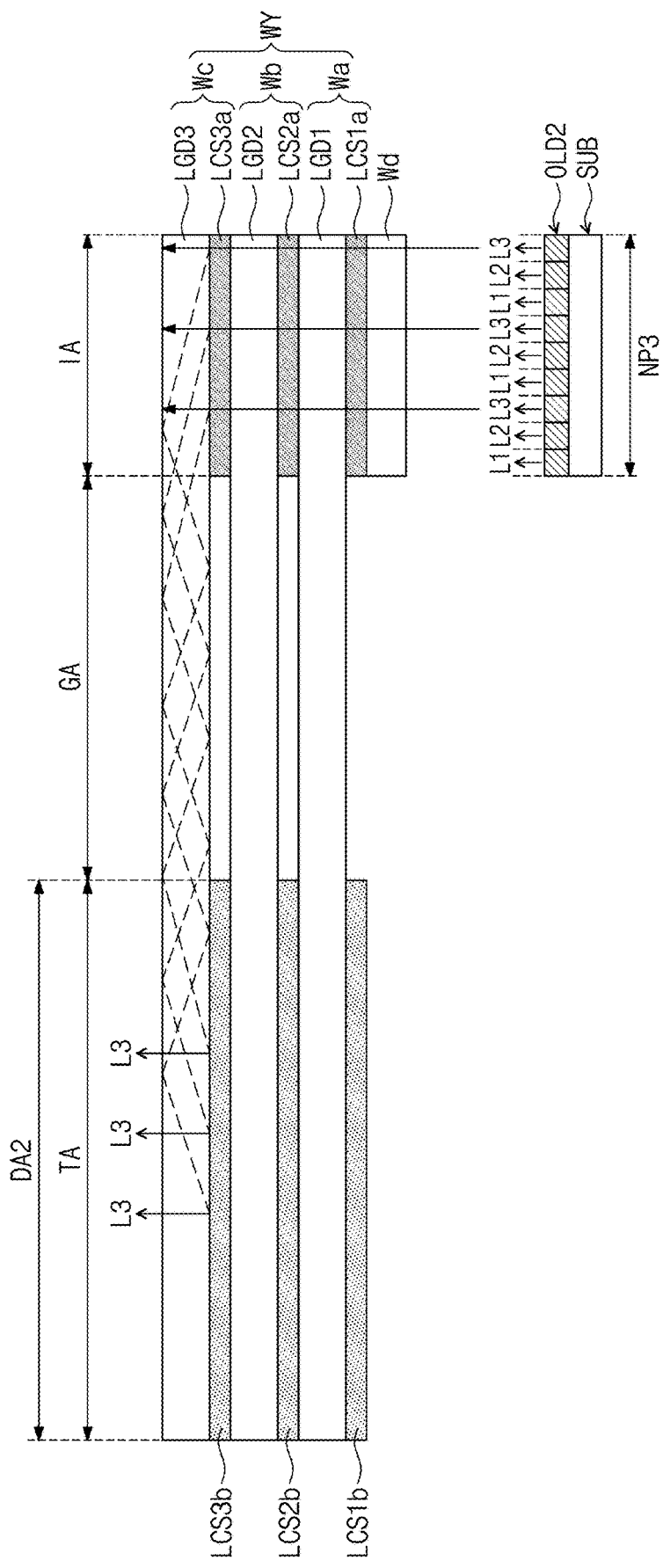
FIG. 9C is a cross-sectional view illustrating an exemplary embodiment of a light control layer, which is used to control a propagation path of a third light, according to the invention.

FIG. 8 is a cross-sectional view illustrating an exemplary embodiment of a light control layer according to the invention. FIG. 9A is a cross-sectional view illustrating an exemplary embodiment of a light control layer, which is used to control a propagation path of the first light, according to the invention. FIG. 9B is a cross-sectional view illustrating a light control layer, which is used to control a propagation path of the second light, according to the invention. FIG. 9C is a cross-sectional view illustrating an exemplary embodiment of a light control layer, which is used to control a propagation path of a third light, according to the invention.

Referring to FIG. 8, the second display elements OLD2 may emit the second light. The second light may include first to third sub-lights L1, L2, and L3. In an exemplary embodiment, the second display elements OLD2 may include at least one first device emitting the first sub-light L1, at least one second device emitting the second sub-light L2, and at least one third device emitting the third sub-light L3, for example. Each of the second display elements OLD2 may correspond to one pixel shown in FIG. 5B.

In an exemplary embodiment, the second light, which is emitted from the second display elements OLD2 of the display panel DP, may be emitted to the outside through the third region TA. As a result, the second image IM2 (e.g., refer to FIG. 2B) corresponding to the second light may be displayed through the second display region DA2.

In detail, referring to FIG. 9A, the first sub-lights L1 of the second light emitted from the second display elements OLD2 may be incident into the first optical waveguide LGD1 through the first diffraction by the first diffraction pattern LCS1a. The second sub-lights L2 and the third sub-lights L3 may pass through the first diffraction pattern LCS1a.

The first sub-lights L1 may be guided toward the third region TA by the total reflection in the first optical waveguide LGD1. The second diffraction pattern LCS1b may cause the second diffraction of the first sub-lights L1 in the third region TA. As a result, the first sub-lights L1 may be emitted to the rear surface DD-DS of the display device DD through the third region TA.

Referring to FIG. 9B, the second sub-lights L2 of the second light emitted from the second display elements OLD2 may be incident into the second optical waveguide LGD2 through the first diffraction by the third diffraction pattern LCS2a. The third sub-lights L3 may pass through the third diffraction pattern LCS2a.

The second sub-lights L2 may be guided toward the third region TA by the total reflection in the second optical waveguide LGD2. The fourth diffraction pattern LCS2b may cause the second diffraction of the second sub-lights L2. As a result, the second sub-lights L2 may be emitted to the rear surface DD-DS of the display device DD through the third region TA.

Referring to FIG. 9C, the third sub-lights L3 of the second light emitted from the second display elements OLD2 may be incident into the third optical waveguide LGD3 through the first diffraction by the fifth diffraction pattern LCS3a.

The third sub-lights L3 may be guided toward the third region TA by the total reflection in the third optical waveguide LGD3. The sixth diffraction pattern LCS3b may cause the second diffraction of the third sub-lights L3. As a result, the third sub-lights L3 may be emitted to the rear surface DD-DS of the display device DD through the third region TA.

The operations described with reference to FIGS. 9A to 9C may be performed at the same time. In an exemplary embodiment, the second display elements OLD2 may emit the first to third sub-lights L1 to L3 at the same time, for example.

Figure 10:
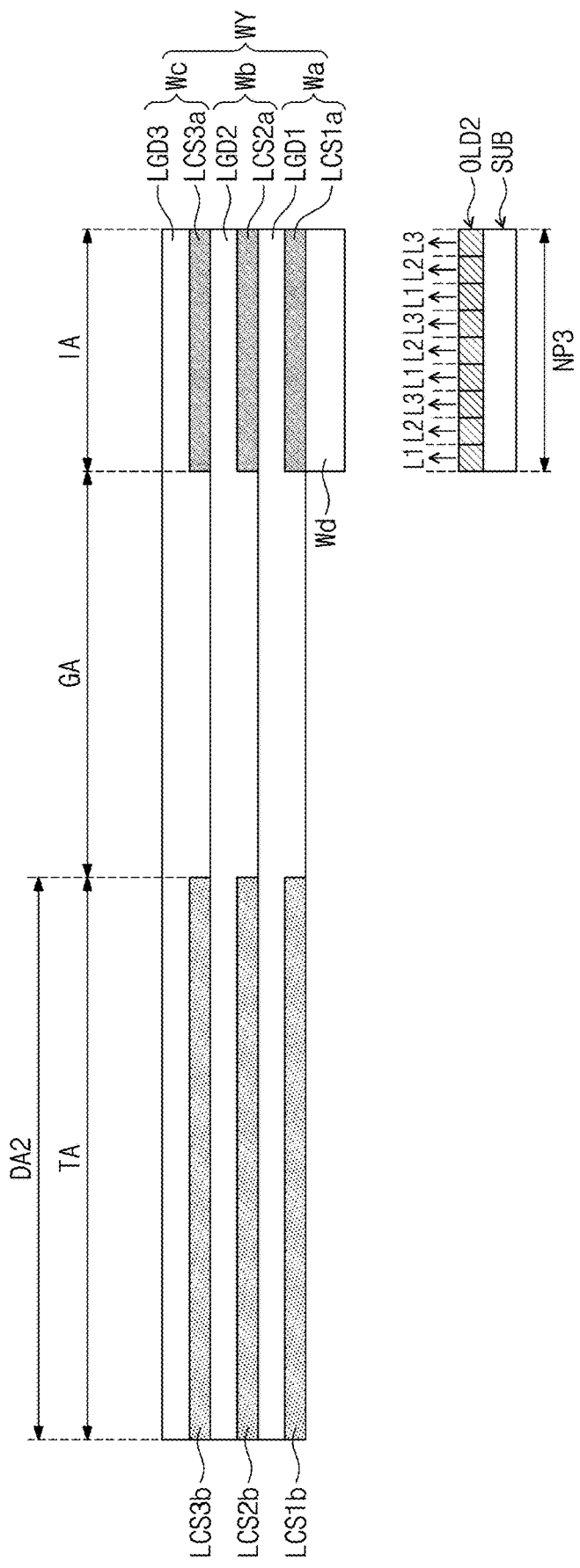
FIG. 10 is a cross-sectional view illustrating an exemplary embodiment of a light control layer according to the invention.

FIG. 10 is a cross-sectional view illustrating an exemplary embodiment of a light control layer according to the invention.

Referring to FIG. 10, the first diffraction pattern LCS1a and the second diffraction pattern LCS1b may be disposed in the first optical waveguide LGD1. In this case, the first diffraction pattern LCS1a and the second diffraction pattern LCS1b may correspond to the bottom surface of the first optical waveguide LGD1.

The third diffraction pattern LCS2a and the fourth diffraction pattern LCS2b may be disposed in the second optical waveguide LGD2. In this case, the third diffraction pattern LCS2a and the fourth diffraction pattern LCS2b may correspond to the bottom surface of the second optical waveguide LGD2.

The fifth diffraction pattern LCS3a and the sixth diffraction pattern LCS3b may be disposed in the third optical waveguide LGD3. In this case, the fifth diffraction pattern LCS3a and the sixth diffraction pattern LCS3b may correspond to the bottom surface of the third optical waveguide LGD3.

According to an exemplary embodiment of the invention, a display device may display an image on both of front and rear surfaces, using a single display panel. The display device may display a first image on the front surface using a first light emitted from first display elements and may display a second image on the rear surface using a light control layer, which controls a propagation path of a second light emitted from second display elements.

Since the single display panel is used to display an image on each of the front and rear surfaces, it may be possible to reduce a total fabrication cost of the display device.

While exemplary embodiments of the invention have been particularly shown and described, it will be understood by one of ordinary skill in the art that variations in form and detail may be made therein without departing from the spirit and scope of the attached claims.

What is claimed is:

1. A display device, comprising:
   a base substrate including a first folding portion folded along a first folding axis, a first portion adjacent to an end of the first folding portion, and a second portion adjacent to an opposite end of the first folding portion, the second portion having a planar area smaller than a planar area of the first portion and facing the first portion in a thickness direction;
   a display element layer including first display elements, which are disposed on the first portion and emit a first light, and second display elements, which are disposed on the second portion and emit a second light; and
   a light control layer comprising a first region, which is disposed on the second portion and causes a first diffraction of the second light emitted from the second display elements, a second region, which guides the second light provided from the first region, and a third region, which is spaced apart from the first region with the second region interposed therebetween and emits the second light to an outside through a second diffraction of the second light.

2. The display device of claim 1, wherein the planar area of the second portion is about 3 percent to about 30 percent of the planar area of the first portion in a plan view.

3. The display device of claim 1, wherein the first region overlaps the second portion, and the third region does not overlap the second portion.

4. The display device of claim 1, wherein the light control layer further comprises:
   a first light control layer which is disposed on the second display elements and emits a first sub-light, which is a first part of the second light within a first wavelength range, to the outside through the first diffraction and the second diffraction;
   a second light control layer which is disposed on the first light control layer and emits a second sub-light, which is a second part of the second light within a second wavelength range different from the first wavelength range, to the outside through the first diffraction and the second diffraction; and
   a third light control layer which is disposed on the second light control layer and emits a third sub-light, which is a third part of the second light within a third wavelength range different from the first and second wavelength ranges, to the outside through the first diffraction and the second diffraction.

5. The display device of claim 4, wherein each of the first to third light control layers comprises:
   a first diffraction pattern which is disposed on the second portion and causes the first diffraction of a corresponding one of the first to third sub-lights;
   an optical waveguide which is disposed on the first diffraction pattern and guides the sub-light, which is diffracted by the first diffraction at the first diffraction pattern; and a second diffraction pattern which is spaced apart from the first diffraction pattern and causes the second diffraction of the sub-light provided from the optical waveguide.

6. The display device of claim 5, wherein the first diffraction pattern and the second diffraction pattern are disposed on a rear surface of the optical waveguide.

7. The display device of claim 5, wherein the first diffraction pattern and the second diffraction pattern are disposed in the optical waveguide.

8. The display device of claim 5, wherein the optical waveguide overlaps the first to third regions.

9. The display device of claim 4, further comprising a fourth light control layer, which is disposed between the first light control layer and the second display elements and receives the second light,
wherein the fourth light control layer is a collimator lens.

10. The display device of claim 1, wherein a planar area of the third region is larger than the planar area of the first region in a plan view.

11. The display device of claim 1, wherein the first light emitted from the first display elements is displayed to the outside through a first display surface corresponding to the first portion, and the second light emitted from the second display elements is displayed to the outside through a second display surface corresponding to the third region.

12. The display device of claim 1, wherein the first portion comprises a second folding portion, which is folded along a second folding axis, and a first non-folding portion and a second non-folding portion, which are spaced apart from each other with the second folding portion interposed therebetween, and
the second non-folding portion faces the second portion corresponding to a third non-folding portion.

13. The display device of claim 12, wherein the first portion is operated in one of a first mode, in which the second folding portion is folded, and a second mode, in which the second folding portion is non-folded, and
in the second mode, the light control layer overlaps the second non-folding portion and non-overlaps the first non-folding portion.

14. The display device of claim 13, wherein the first mode comprises:
an inward folding mode, in which only the second light is emitted from the second display elements; and
an outward folding mode, in which only the first light is emitted from the first display elements.

15. The display device of claim 1, wherein the display element layer further comprises third display elements disposed on the first folding portion.

16. The display device of claim 1, further comprising an input-sensing layer disposed on the first portion.

17. A display device, comprising:
a display panel which comprises a first folding portion, a first portion, which is adjacent to an end of the first folding portion and defines a first display surface, and a second portion, which is adjacent to an opposite end of the first folding portion and has a planar area smaller than a planar area of the first portion, and emits a first light through the first portion and a second light through the second portion; and
a light control layer disposed on the display panel, the light control layer comprising a first region, which causes a first diffraction of the second light emitted from the second portion, a second region, which guides the second light provided from the first region, and a third region, which causes a second diffraction of the second light and defines a second display surface.

18. The display device of claim 17, wherein the first portion comprises a second folding portion, a first non-folding portion adjacent to an end of the second folding portion, and a second non-folding portion, which is adjacent to an opposite end of the second folding portion and faces the second portion, and
a planar area of the third region is smaller than a planar area of the second non-folding portion.

19. The display device of claim 17, wherein only one of the first and second display surfaces displays an image.

20. A display device, comprising:
a display panel comprising a folding region folded along a folding axis, a first light-emitting region adjacent to an end of the folding region, and a second light-emitting region adjacent to an opposite end of the folding region, the first light-emitting region which emits a first light and defining a first display surface, the second light-emitting region which overlaps the first light-emitting region, emits a second light, and has a planar area smaller than a planar area of the first light-emitting region; and
a light control layer which defines a second display surface and emits the second light emitted from the second light-emitting region to an outside through diffraction,
wherein the second light is emitted through the second display surface, when the first light-emitting region is in a folded state, and
the first light is emitted through the first display surface, when the first light-emitting region is in a non-folded state.

* * * * *